US011820668B2

(12) United States Patent
Choy et al.

(10) Patent No.: US 11,820,668 B2
(45) Date of Patent: Nov. 21, 2023

(54) METHODS FOR MANUFACTURING SPINEL-TYPE TERNARY METAL OXIDES AS HOLE TRANSPORT MATERIALS

(71) Applicant: THE UNIVERSITY OF HONG KONG, Hong Kong (HK)

(72) Inventors: Chik Ho Wallace Choy, New Territories (HK); Zhanfeng Huang, Hong Kong (HK); Yangdan Ou, Kennedy Town (HK)

(73) Assignee: THE UNIVERSITY OF HONG KONG, Hong Kong (HK)

( * ) Notice: Subject to any disclaimer, the term of this patent is extended or adjusted under 35 U.S.C. 154(b) by 523 days.

(21) Appl. No.: 17/057,119

(22) PCT Filed: Jul. 18, 2019

(86) PCT No.: PCT/CN2019/096468
§ 371 (c)(1),
(2) Date: Nov. 20, 2020

(87) PCT Pub. No.: WO2020/020039
PCT Pub. Date: Jan. 30, 2020

(65) Prior Publication Data
US 2021/0198120 A1   Jul. 1, 2021

Related U.S. Application Data

(60) Provisional application No. 62/702,088, filed on Jul. 23, 2018.

(51) Int. Cl.
*C01G 51/00*   (2006.01)
*H01L 31/032*   (2006.01)
(Continued)

(52) U.S. Cl.
CPC ............... *C01G 51/40* (2013.01); *C01G 1/02* (2013.01); *H01L 31/032* (2013.01); *H01L 33/26* (2013.01);
(Continued)

(58) Field of Classification Search
CPC ......... C01G 51/40; C01G 1/02; H01L 31/032; H01L 33/26; H01L 31/022425;
(Continued)

(56) References Cited

U.S. PATENT DOCUMENTS

2010/0181200 A1*   7/2010   Yang ..................... B82Y 40/00
427/113

OTHER PUBLICATIONS

International Search Report and Written Opinion for International Application No. PCT/CN2019/096468 dated Oct. 10, 2019, 6 pages.
(Continued)

*Primary Examiner* — Karen Kusumakar
(74) *Attorney, Agent, or Firm* — AMIN, TUROCY & WATSON, LLP

(57) ABSTRACT

Methods for preparation of surfactant-free ultra-small spinel ternary metal oxide nanoparticles are provided. A method comprises dissolving first and second metal salts in deionized water in a specific mole ratio to form a solution comprising two different metal ions, applying a coprecipitation method and adding an alkaline solution to the solution to form a colloidal suspension, wherein a colloid of the colloidal suspension is a metal hydroxide, adjusting the amount and the addition rate of the alkaline solution to form a specific structure of metal hydroxide precipitate; washing and drying the metal hydroxide to form a structured metal hydroxide powder, and applying a calcination method to the structured metal hydroxide powder to form a surfactant-free spinel-type ($AB_2O_4$) ternary metal oxide, wherein A and B each respectively comprise a metal element.

20 Claims, 3 Drawing Sheets

(51) Int. Cl.
*H01L 33/26* (2010.01)
*C01G 1/02* (2006.01)

(52) U.S. Cl.
CPC ...... *C01P 2002/32* (2013.01); *C01P 2002/72* (2013.01); *C01P 2002/88* (2013.01); *C01P 2004/04* (2013.01); *C01P 2004/24* (2013.01); *C01P 2006/40* (2013.01)

(58) Field of Classification Search
CPC .............. C01P 2002/32; C01P 2002/72; C01P 2002/88; C01P 2004/04; C01P 2004/24; C01P 2006/40; C01P 2004/40; C01P 2004/64; H10K 30/353; H10K 85/113; H10K 85/151; H10K 99/00; Y02P 70/50; Y02E 10/549
See application file for complete search history.

(56) References Cited

OTHER PUBLICATIONS

Choi, et al. "Solution processed WO3 layer for the replacement of PEDOT:PSS layer in organic photovoltaic cells", Organic Electronics 13, 2012, pp. 959-968.

Irwin, et al. "p-Type semiconducting nickel oxide as an efficiency-enhancing anode interfacial layer in polymer bulk-heterojunction solar cells", PNAS, Feb. 26, 2008, vol. 105, No. 8, pp. 2783-2787.

Jiang, et al. "Post-treatment-Free Solution-Processed Non-stoichiometric NiOx Nanoparticles for Efficient Hole-Transport Layers of Orrganic Optoelectronic Devices", Adv. Mater., 2015.

Li, et al. "Room-temperature solution-processed molybdenum oxide as a hole transport layer with Ag nanoparticles for highly efficient inverted organic solar cells", J. Mater. Chem. A, 2013, 1, pp. 6614-6621.

Stubhan, et al. High Fill Factor Polymer Solar Cells Incorporating a Low Temperature Solution Processed WO3 Hold Extraction Layer, Adv. Energy Mater., 2012.

Wang, et al. "Recent Developments in p-Type Oxide Semiconductor Materials and Devices", Adv. Mater., 2016, 28, pp. 3831-3892.

Wang, et al. "Solution Synthesized p-Type Copper Gallium Oxide Nanoplates as Hole Transport Layer for Organic Photovoltaic Devices", J. Phys. Chem. Lett., 2015, 6, pp. 1071-1075.

Wang, et al. "Sub-10 nm copper chromium oxide nanocrystals as a solution processed p-type hole transport layer for organic photovoltaics", J. Mater. Chem. C, 2016, 4, pp. 3607-3613.

Xie, et al. "Low-Temperature Solution-Processed Hydrogen Molybdenum and Vanadium Bronzes for an Efficient Hole-Transport Layer in Orrganic Electronics", Adv. Mater, 2013, 25, pp. 2051-2055.

* cited by examiner

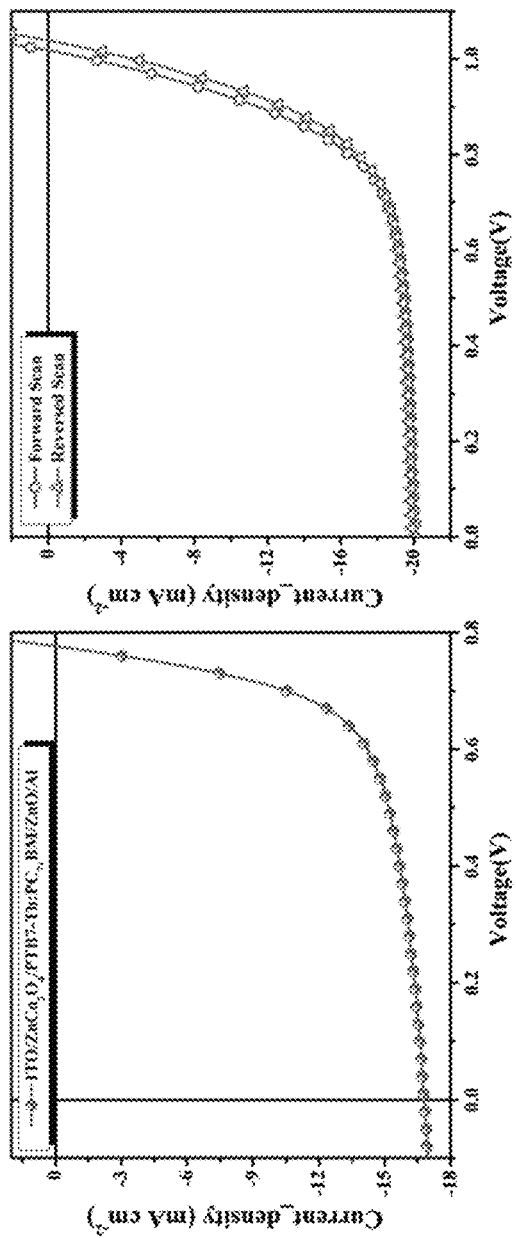

METHODS FOR MANUFACTURING SPINEL-TYPE TERNARY METAL OXIDES AS HOLE TRANSPORT MATERIALS

FIELD OF THE INVENTION

Embodiments of the subject invention relate to methods for using ternary metal oxides as hole transport materials.

BACKGROUND OF THE INVENTION

Poly(3,4-ethylenedioxythiophene):poly(styrenesulfonic acid) (PEDOT:PSS) is commonly used to fabricate a hole transport layer (HTL) in conventional thin film optoelectronic devices, such as organic solar cells (OSCs). However, due to its acidic and hygroscopic nature, PEDOT:PSS will generally be detrimental to device stability. Producing an efficient HTL requires forming thin films with good coverage, small roughness, and low series resistance. Conventional methods rely on a surfactant to prepare small-sized particles, but these methods need post-treatment to remove the surfactant to ensure good electrical conduction. Therefore, it is desirable to develop a method that produces ultra-small and surfactant-free nanoparticles.

BRIEF SUMMARY OF THE INVENTION

Embodiments of the subject invention provide a method of preparing a hole transport material of spinel-type ($AB_2O_4$) ternary metal oxide that is ligand-free and has particles that are less than 10 nm in size, wherein A and B each represent a respective metal element. The method describes preparing a solution containing two metal ions by dissolving metal salts in deionized water in a specific mole ratio and using a coprecipitation technique to prepare a colloidal suspension of metal hydroxides in deionized water by adding an alkaline solution to the solution containing the two metal ions. Controlling the amount and the addition rate of the alkaline solution assists the metal hydroxides to form the shape of a nanoplate, a nanoplate with wrinkle, a nanoflower, or a mixture thereof. After washing and drying the metal hydroxides, a structured metal hydroxide powder is obtained. The structured metal hydroxide contains ions and water molecules, the combination of which results in ultra-small size metal hydroxide particles and a stable dispersion of the metal hydroxide particles. Finally, a spinel-type ternary metal oxide is prepared by calcination of the structured metal hydroxide powder.

Specifically, the present invention provides the following technical solutions:

Solution 1. A method of preparing a surfactant-free spinel-type ($AB_2O_4$) ternary metal oxide, the method comprising:
  dissolving first and second metal salts in deionized water in a specific molar ratio to form a solution comprising two different metal ions;
  applying a coprecipitation method and adding an alkaline solution to the solution comprising two different metal ions to form a colloidal suspension,
  wherein a colloid of the colloidal suspension is a metal hydroxide;
  adjusting the amount and the addition rate of the alkaline solution to form a specific structure of metal hydroxide precipitate;
  washing and drying the metal hydroxide precipitate to form a structured metal hydroxide powder; and
  applying a calcination method to the structured metal hydroxide powder to form a surfactant-free spinel-type ($AB_2O_4$) ternary metal oxide,
  wherein A and B each respectively comprise a metal element.

Solution 2. The method of Solution 1, wherein a particle of the metal hydroxide in the suspension has a diameter of less than 10 nm.

Solution 3. The method of any of Solutions 1-2, wherein the surfactant-free spinel-type ($AB_2O_4$) ternary metal oxide has crystal structure with an atomic ratio of A:B:O that is 1:2:4.

Solution 4. The method of any of Solutions 1-3, wherein metal element A is nickel, zinc, cobalt, or iron; and wherein metal element B is gallium, iron, chromium, or cobalt.

Solution 5. The method of any of Solutions 1-4, wherein the metal hydroxide is a mixture of a metal hydroxide $A(OH)_x$ and a metal hydroxide $B(OH)_y$, or a hydroxide compound of $AB_x(OH)_y$, wherein each x and y are a respective stoichiometric number.

Solution 6. The method of Solution 5, wherein the hydroxide compound comprises a crystal structure containing metal element A and metal element B, wherein metal element A and metal element B interact with each other, or both metal element A and metal element B interact with a same species.

Solution 7. The method of Solution 6, wherein metal element A and metal element B interact through a chemical bond, a coordinate bond, or a mixture thereof.

Solution 8. The method of any of Solutions 1-7, wherein the alkaline solution contains one or more solute selected from the group consisting of NaOH, KOH, $NH_4OH$, $Na_2CO_3$, $NaHCO_3$, $K_2CO_3$, $KHCO_3$, $(NH_4)_2CO_3$, $NH_4HCO_3$, $CH_3COONa$, and $CH_3COOK$.

Solution 9. The method of any of Solutions 1-8, wherein the specific structure of the metal hydroxide comprises a nanoplate, a nanoplate with a wrinkle, a nanoflower, or a mixture thereof.

Solution 10. The method of any of Solutions 1-9, wherein the structured metal hydroxide powder has a formula of $A(OH)_x(C^-)_y(H_2O)_z$, $B(OH)_x(C^-)_y(H_2O)z$, or $AB_n(OH^-)_x(C)_y(H_2O)_z$, wherein $OH^-$ is a hydroxide ion, $C^-$ is an anion from the metal salts or the alkaline solution, and n, x, y, and z are each a respective stoichiometric number.

Solution 11. The method of any of Solutions 1-10, wherein drying the metal hydroxide precipitate comprises thermal drying, vacuum drying, or natural drying.

Solution 12. The method of any of Solutions 1-11, wherein the surfactant-free spinel-type ($AB_2O_4$) ternary metal oxide is a composite comprising $AB_2O_4$ and another species selected from AO, $B_2O_3$, a metal oxide hydroxide BOOH, and an intercalated $AB_2O_4$.

Solution 13. The method of Solution 12, wherein the intercalated $AB_2O_4$ is in a form of $(A_{1-x}B_x)B_2O_4$, wherein $B_x$ is a reduced metal ion with valence of $2^+$, and wherein x is a stoichiometric number.

Solution 14. The method of any of Solutions 1-13, wherein the calcination of the structured metal hydroxide powder comprises a solvothermal method, thermal calcination under an ambient condition, or calcination under a reactive atmosphere comprising nitrogen, argon, and hydrogen.

Solution 15. The method of Solution 14, wherein the solvothermal method comprises using a solvent selected from water, ethanol, methanol, isopropanol, butanol, benzyl alcohol, ethylene glycol, glycerin, and any mixture thereof.

Solution 16. The method of any of Solutions 1-15, further comprising:
forming a ternary oxide solution by dispersing the surfactant-free spinel-type ($AB_2O_4$) ternary metal oxide into a solvent; and
forming a ternary metal oxide-based film by processing the ternary oxide solution.

Solution 17. The method of Solution 16, wherein the solvent is selected from deionized water, methanol, ethanol, propanol, butanol, chlorobenzene, dichlorobenzene, and any mixture thereof.

Solution 18. The method of Solution 16, wherein processing the ternary oxide solution comprises using one or more of a casting technique, a spin-coating technique, a doctor blading technique, a screen printing technique, an ink jet printing technique, a pad printing technique, and a roll-to-roll technique.

Solution 19. An optoelectronic device, comprising:
a ternary metal oxide-based film formed according to any of Solutions 16-18,
wherein the ternary metal oxide-based film is a carrier transport layer or an electrode of an optoelectronic device.

Solution 20. The optoelectronic device of Solution 19, wherein the optoelectronic device is selected from a solar cell, a phototransistor, a photomultiplier, a photoresistor, a light-emitting diode, a laser diodes, a photocatalytic electrode, and a sensor.

BRIEF DESCRIPTION OF THE DRAWINGS

FIG. 3A is a plot of representative J-V characteristics of a $PTB_7$-Th:$PC_{71}BM$ based OSCs device using zinc cobalt oxide as an HTL. FIG. 3B is a plot of representative J-V characteristics of a $MAPbI_{3-x}Cl_x$ perovskite based device using zinc cobalt oxide as an HTL with forward and reversed scan.

DETAILED DISCLOSURE OF THE INVENTION

The following disclosure and exemplary embodiments are presented to enable one of ordinary skill in the art to make and use ternary metal oxides as hole transport materials, according to the subject invention. Various modifications to the embodiments will be readily apparent to those skilled in the art and the generic principles herein may be applied to other embodiments. Thus, the devices and methods related to the use of ternary metal oxides as hole transport materials are not intended to be limited to the embodiments shown, but are to be accorded the widest scope consistent with the principles and features described herein.

Figure 1A:
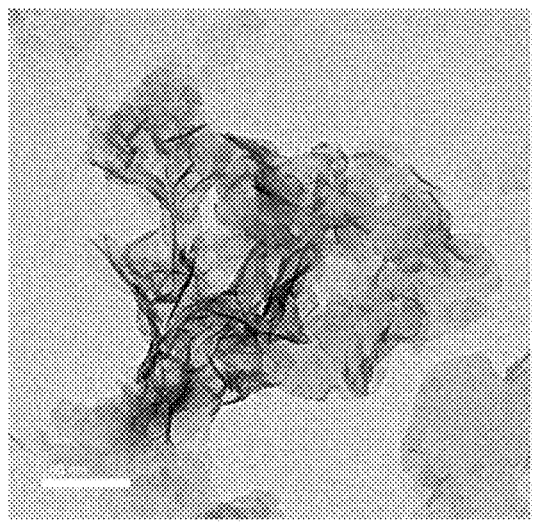
FIG. 1A is a TEM image of a prepared flower-like or thin-nanoplate zinc cobalt hydroxide.
Figure 1B:
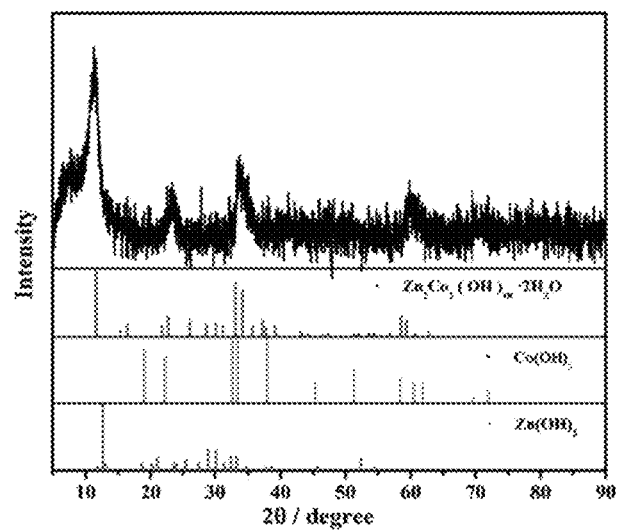
FIG. 1B is a plot of an x-ray diffraction (XRD) pattern of a prepared structured zinc cobalt hydroxide.

Embodiments of the subject invention provide a method of using decomposition coprecipitated structured hydroxide (DCSH) to prepare ultra-small spinel ternary metal oxide nanoparticles that form an effective HTL. By controlling the amount of alkaline solution through an addition rate, the pH of the solution can be carefully controlled to obtain a flower-like or thin-nanoplate metal hydroxide as shown in FIG. 1A. These metal hydroxides are crystallized and bound with water molecules, as can be shown by a plot of XRD results (see, for example, FIG. 1B).

A method of preparing a ligand-free spinel-type ($AB_2O_4$) ternary metal oxide can have an initial step of preparing a solution containing two metal ions by dissolving metal salts in deionized water in a specific molar ratio within a range of 0.3 to 2, wherein A and B are each respective metals. Metal A can be selected from a group comprising of nickel, zinc, cobalt, and iron. Metal B can be selected from a group comprising of gallium, iron, chromium, and cobalt. In one embodiment, the spinel-type ($AB_2O_4$) ternary metal oxide has a crystal structure with an atomic ratio of A:B:O equal to or approximately equal to 1:2:4.

A next step can be to prepare a colloidal suspension of metal hydroxides in deionized water by using a coprecipitation technique along with adding an alkaline solution to the solution containing the two metal ions. In one embodiment, the metal hydroxide precipitate comprises a mixture of a metal hydroxide $A(OH)_x$ and a metal hydroxide $B(OH)_y$, or a hydroxide compound of $AB_x(OH)_y$, wherein x and y are each a respective stoichiometric number. The hydroxide compound can comprise a crystal containing both metals A and B, in which metals A and B either interact with each other or each interact with a same species, including $O_2^-$ or $OH^-$. The metals A and B can interact through a chemical bond, a coordinate bond, or a mixture thereof.

The shapes of the resulting metal hydroxide precipitate can be controlled by adjusting the amount and the addition rate of the alkaline solution. The alkaline solution can contain one or more solute selected from the group consisting of NaOH, KOH, $NH_4OH$, $Na_2CO_3$, $NaHCO_3$, $K_2CO_3$, $KHCO_3$, $(NH_4)_2CO_3$, $NH_4HCO_3$, $CH_3COONa$, and $CH_3COOK$. The shape of the metal hydroxide precipitate can comprise a nanoplate, a nanoplate with a wrinkle, or a nanoflower, or a mixture of any thereof.

A next step can be to prepare a structured metal hydroxide powder by washing and drying the structured metal hydroxide precipitate. The structured metal hydroxide powder can be described as $A(OH)_x(C^-)_y(H_2O)_z$, $B(OH)_x(C^-)_y(H_2O)_z$, or $AB_n(OH^-)_x(C^-)_y(H_2O)_z$, wherein $OH^-$ is a hydroxide ion, $C^-$ is an anion from the metal salts or the alkaline solution, and n, x, y, and z are each a respective stoichiometric number. Drying the structured metal hydroxide can be performed by thermal drying, vacuum drying, or natural drying.

A final step can be to prepare a spinel-type ternary metal oxide by calcination of the structured metal hydroxide powder. The spinel-type ternary metal oxide can be a composite comprising $AB_2O_4$ and other species selected from AO or $B_2O_3$, a metal oxide hydroxide BOOH, and an intercalated $AB_2O_4$. The intercalated $AB_2O_4$ can be in a form of $(A_{1-x}B_x)B_2O_4$, where $B_x$ is a reduced metal ion with a valence of 2.

The method can further comprise forming a ternary oxide solution by dispersing the spinel-type ternary metal oxide into a solvent and forming a ternary metal oxide-based film by processing the ternary oxide solution. The solvent can be selected from a group comprising deionized water, methanol, ethanol, propanol, butanol, chlorobenzene, dichlorobenzene, or a mixture thereof. The technique for processing the ternary oxide solution can comprise using one or more technique including casting, spin-coating, doctor blading, screen printing, ink jet printing, pad printing, and roll-to-roll processing.

In one embodiment, the ternary metal oxide-based film is used as a carrier transport layer or an electrode of an optoelectronic device. The optoelectronic device can be selected from a group comprising solar cells, phototransistors, photomultipliers, photoresistors, light-emitting diodes, laser diodes, photocatalytic electrode, and sensors.

The ultra-small size of the metal hydroxides is derived from the presence of the water molecules. During the calcination of the structured metal hydroxide powder, the structured metal hydroxides decompose and form ultra-small nanoparticles. The ultra-small nanoparticles can disperse in DI water without the assistance of a functional surface ligand or a surfactant. The calcination technique of the structured metal hydroxide comprises a solvothermal method, thermal calcination under an ambient condition, or calcination under a reactive atmosphere of nitrogen, argon, and hydrogen. The solvothermal method can use a solvent selected from water, ethanol, methanol, isopropanol, butanol, benzyl alcohol, ethylene glycol, glycerin, or a mixture of any thereof.

In conventional methods, post-treatments are also needed to remove a surface group to lower the carrier transmission resistance. However, the nanoparticles prepared using the methods described herein do not contain any ligands or surfactants, (such as groups of carboxyl, epoxy, amino, and sulfonic acid), thereby resulting in a post-treatment free HTL for optoelectronic devices. Additionally, the features of being ultra-small and well-dispersed ensure the formation of a smooth and compact film.

An efficient HTL has a suitable band structure and good hole mobility, and in particular an HTL has a low roughness value and provides continuous surface coverage. A pin-hole in an HTL can lead to direct contact of an active layer and an electrode, which can result in recombination and a leakage current. A nanoparticle with a small diameter (less than 10 nm) tends to disperse well in a suspension with no or limited aggregation. A colloidal suspension with dispersed ultra-small nanoparticles is suitable for forming a smooth HTL thin film that has a small thickness and provides continuous surface coverage. Additionally, the ultra-small nanoparticles can be produced by the decomposition of the structured metal hydroxides. This method decouples the material synthesis and the film formation, which allows for different strategies to be employed to confront different problems from various situations.

As an example, in solar cell fabrication, a deposited layer should not destroy any previously deposited layers. A previously deposited layer can be destroyed by the dissolution of a solvent, reaction between used chemicals, and post-treatment. Conventional methods require a post-treatment phase to enhance crystallization and to remove any byproducts, which limits the methods to deposition on a flexible substrate and on the top of an active layer. Therefore, a pre-synthesized nanocrystal that disperses well in different solvents is desirable to cater to the needs of various situations.

The formation of an ultra-small nanoparticle can depend upon the structured metal hydroxide used during the synthesis of the ultra-small nanoparticle. To prepare these structured ultra-small nanoparticles, the respective synthesis pH and synthesis time can be controlled by the amount and the addition rate of an alkaline solution into the solution of metallic ions. At a low addition rate within 20 mL/min, the pH of the solution can be controlled and a complete reaction can be achieved. A higher pH (pH over 12) of the solution and a long reaction time (over 6 hours) can cause the hydroxide to dehydrate. The dehydration of the hydroxide can create a pure hydroxide not bound with water molecules and an anion, which results in large-size undispersed aggregative oxide particles after calcination.

In one embodiment, the structured metal hydroxide can be in the form of $A(OH)_x(C^-)_y(H_2O)_z$ with $B(OH)_x(C^-)_y(H_2O)_z$, or $AB_n(OH^-)_x(C^-)_y \cdot z(H_2O)$, wherein A and B are each a respective metal ion, $OH^-$ is a hydroxide ion, $C^-$ is an anion from metal salts or alkaline solution, and n, x, y, and z are each a respective stoichiometric number. The water molecule and the anion (such as nitrate ion, $NO_3^-$) play a role in forming the ultra-small nanoparticles, as the addition of ions and water molecules induce an inner crystal pressure that assists with breaking down the structured hydroxide.

Figure 2B:
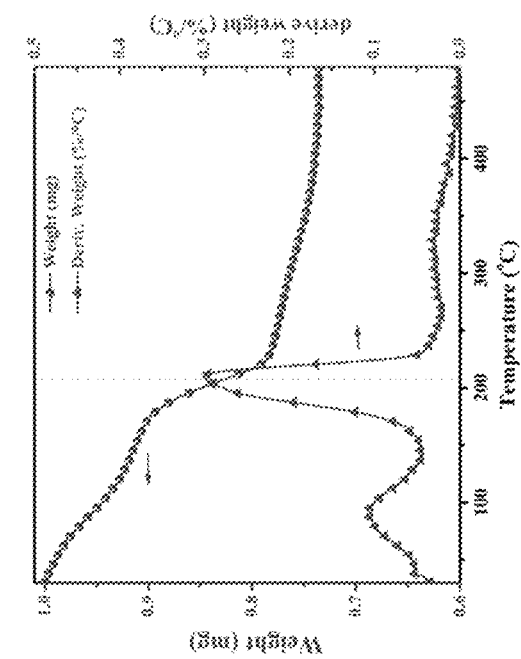
FIG. 2B is a TEM image of small zinc cobalt oxide nanoparticles prepared from a decomposition of precipitated structured hydroxide (DCSH) method.
Figure 2A:
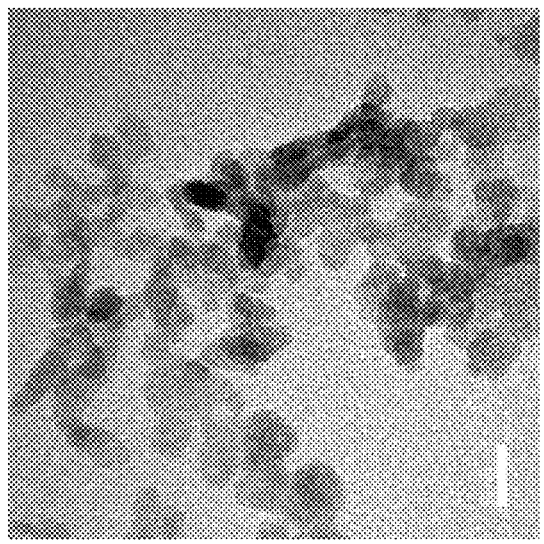
FIG. 2A is a typical thermogravimetric analysis curve of zinc cobalt hydroxide with a heating rate of 10 C.°/min.

Apart from the ions and waters molecules, the calcination temperature and calcination time can also have an effect on the degree of dispersion. The effect of calcination temperature can be seen by a thermogravimetric analysis (TGA) curve. For example, as shown in FIG. 2A, the weight loss mainly occurs at a range of 150 to 250° C. that is responding to the decomposition of hydroxide. However, increasing the time of calcination above a threshold time can result in aggregation of the ultra-small nanoparticles and a calcination time below a threshold amount can be too short to allow the electrical insulated hydroxide to decompose completely, which limits the conductivity of the HTL. Therefore in preferred embodiments, calcination can be optimized at approximately 200° C. within a specified time frame (from 0.5 hours to 10 hours) to result in an ultra-small ternary metal oxide that disperses well, as shown in FIG. 2B.

All patents, patent applications, provisional applications, and publications referred to or cited herein are incorporated by reference in their entirety, including all figures and tables, to the extent they are not inconsistent with the explicit teachings of this specification.

Following are examples that illustrate procedures for practicing the invention. These examples should not be construed as limiting. All percentages are by weight and all solvent mixture proportions are by volume unless otherwise noted.

Example 1

To demonstrate the potential of the ternary metal oxide, low bandgap fullerene based organic solar cells (OSCs) were fabricated utilizing the low bandgap material poly[4,8-bis (5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene-)-2-carboxylate-2-6-diyl)] ($PTB_7$-Th) with [6,6]-Phenyl-$C_{71}$-butyric acid methyl ester ($PC_{71}BM$) as an active layer. A device was prepared with a structure as follows: ITO/$ZnCo_2O_x$/$PTB_7$-Th: $PC_{71}BM$/ZnO/Al. As the prepared ternary metal oxide has the features of being ultra-small and ligand free, an efficient $ZnCo_2O_x$ HTL can be deposited on the ITO substrate by spin-coating without post-treatment. The characteristic current density to voltage curve (J-V) is shown in FIG. 3A. The following additional characteristics were also recorded: 8.6% power conversion efficiency (PCE), a current density ($J_{SC}$) of 16.7 mA/cm$^2$, an open circuit voltage ($V_{OC}$) of 0.78 V, and a fill factor (FF) of 0.657.

Example 2

Perovskite solar cells were prepared using iodide/chloride mixed-halide perovskites ($MAPbI_{3-x}Cl_x$) as a photoactive layer and having the following structure: ITO/$ZnCo_2O_x$/$MAPbI_{3-x}Cl_x$/$PC_{60}BM$:$C_{60}$/ZrAcac/Ag. As shown in FIG. 3B, there is a very small hysteresis between the forward and reversed scans. Specifically, in the forward scan, PCE of 13.37% is realized with the $J_{SC}$ of 20.04 mA/cm$^2$, $V_{OC}$ of 1.01 V, and FF of 0.657. While in the reversed scan, a slightly higher PCE is measured to be 13.60% from the JSC of 19.94 mA/cm$^2$, $V_{OC}$ of 1.04 V, and FF of 0.654.

It should be understood that the examples and embodiments described herein are for illustrative purposes only and that various modifications or changes in light thereof will be suggested to persons skilled in the art and are to be included within the spirit and purview of this application and the scope of the appended claims. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

REFERENCES

[1] Z. Wang, P. K. Nayak, J. A. Caraveo-Frescas, H. N. Alshareef, Adv. Mater. 2016, 28, 3831.
[2] X. Li, W. C. Choy, F. Xie, S. Zhang, J. Hou, J. Mater. Chem. A 2013, 1, 6614. [3] F. Xie, W. C. Choy, C. Wang, X. Li, S. Zhang, J. Hou, Adv. Mater. 2013, 25, 2051.
[4] T. Stubhan, N. Li, N. A. Luechinger, S. C. Halim, G. J. Matt, C. J. Brabec, Adv. Energy Mater. 2012, 2, 1433.
[5] H. Choi, B. Kim, M. J. Ko, D. K. Lee, H. Kim, S. H. Kim, K. Kim, Org. Electron. 2012, 13, 959.
[6] F. Jiang, W. C. Choy, X. Li, D. Zhang, J. Cheng, Adv. Mater. 2015, 27, 2930.
[7] M. D. Irwin, D. B. Buchholz, A. W. Hains, R. P. H. Chang, T. J. Marks, PNAS 2008, 105, 2783.
[8] J. Wang, Y. J. Lee, J. W. P. Hsu, J. Mater. Chem. C 2016, 4, 3607.
[9] J. Wang, V. Ibarra, D. Barrera, L. Xu, Y. J. Lee, J. W. Hsu, J. Phys. Chem. Lett. 2015, 6, 1071.

What is claimed is:

1. A method of preparing a surfactant-free spinel-type (AB$_2$O$_4$) ternary metal oxide, the method comprising:
   dissolving first and second metal salts in deionized water in a specific molar ratio to form a solution comprising two different metal ions;
   applying a coprecipitation method and adding an alkaline solution to the solution comprising two different metal ions to form a colloidal suspension,
   wherein a colloid of the colloidal suspension is a metal hydroxide;
   adjusting the amount and the addition rate of the alkaline solution to form a specific structure of metal hydroxide precipitate;
   washing and drying the metal hydroxide precipitate to form a structured metal hydroxide powder; and
   applying a calcination method to the structured metal hydroxide powder to form a surfactant-free spinel-type (AB$_2$O$_4$) ternary metal oxide,
   wherein A and B each respectively comprise a metal element.

2. The method of claim 1, wherein a particle of the metal hydroxide in the suspension has a diameter of less than 10 nm.

3. The method of claim 1, wherein the surfactant-free spinel-type (AB$_2$O$_4$) ternary metal oxide has crystal structure with an atomic ratio of A:B:O that is 1:2:4.

4. The method of claim 1, wherein metal element A is nickel, zinc, cobalt, or iron; and wherein metal element B is gallium, iron, chromium, or cobalt.

5. The method of claim 1, wherein the metal hydroxide is a mixture of a metal hydroxide A(OH)$_x$ and a metal hydroxide B(OH)$_y$, or a hydroxide compound of AB$_x$(OH)$_y$, wherein each x and y are a respective stoichiometric number.

6. The method of claim 5, wherein the hydroxide compound comprises a crystal structure containing metal element A and metal element B, wherein metal element A and metal element B interact with each other, or both metal element A and metal element B interact with a same species.

7. The method of claim 6, wherein metal element A and metal element B interact through a chemical bond, a coordinate bond, or a mixture thereof.

8. The method of claim 1, wherein the alkaline solution contains one or more solute selected from the group consisting of NaOH, KOH, NH$_4$OH, Na$_2$CO$_3$, NaHCO$_3$, K$_2$CO$_3$, KHCO$_3$, (NH$_4$)$_2$CO$_3$, NH$_4$HCO$_3$, CH$_3$COONa, and CH$_3$COOK.

9. The method of claim 1, wherein the specific structure of the metal hydroxide comprises a nanoplate, a nanoplate with a wrinkle, a nanoflower, or a mixture thereof.

10. The method of claim 1, wherein the structured metal hydroxide powder has a formula of A(OH)$_x$(C$^-$)$_y$(H$_2$O)z, B(OH)$_x$(C$^-$)$_y$(H$_2$O)z, or AB$_n$(OH$^-$)$_x$(C$^-$)$_y$(H$_2$O)$_z$, wherein OH$^-$ is a hydroxide ion, C$^-$ is a anion from the metal salts or the alkaline solution, and n, x, y, and z are each a respective stoichiometric number.

11. The method of claim 1, wherein drying the metal hydroxide precipitate comprises thermal drying, vacuum drying, or natural drying.

12. The method of claim 1, wherein the surfactant-free spinel-type (AB$_2$O$_4$) ternary metal oxide is a composite comprising AB$_2$O$_4$ and another species selected from AO, B$_2$O$_3$, a metal oxide hydroxide BOOH, and an intercalated AB$_2$O$_4$.

13. The method of claim 12, wherein the intercalated AB$_2$O$_4$ is in a form of (A$_{1-x}$B$_x$)B$_2$O$_4$, wherein B$_x$ is a reduced metal ion with valence of 2$^+$, and wherein x is a stoichiometric number.

14. The method of claim 1, wherein the calcination of the structured metal hydroxide powder comprises a solvothermal method, thermal calcination under an ambient condition, or calcination under a reactive atmosphere comprising nitrogen, argon, and hydrogen.

15. The method of claim 14, wherein the solvothermal method comprises using a solvent selected from water, ethanol, methanol, isopropanol, butanol, benzyl alcohol, ethylene glycol, glycerin, and any mixture thereof.

16. The method of claim 1, further comprising:
   forming a ternary oxide solution by dispersing the surfactant-free spinel-type (AB$_2$O$_4$) ternary metal oxide into a solvent; and
   forming a ternary metal oxide-based film by processing the ternary oxide solution.

17. The method of claim 16, wherein the solvent is selected from deionized water, methanol, ethanol, propanol, butanol, chlorobenzene, dichlorobenzene, and any mixture thereof.

18. The method of claim 16, wherein processing the ternary oxide solution comprises using one or more of a casting technique, a spin-coating technique, a doctor blading technique, a screen printing technique, an ink jet printing technique, a pad printing technique, and a roll-to-roll technique.

19. An optoelectronic device, comprising:
a ternary metal oxide-based film formed according to claim 16,
wherein the ternary metal oxide-based film is a carrier transport layer or an electrode of an optoelectronic device.

20. The optoelectronic device of claim 19, wherein the optoelectronic device is selected from a solar cell, a phototransistor, a photomultiplier, a photoresistor, a light-emitting diode, a laser diodes, a photocatalytic electrode, and a sensor.

\* \* \* \* \*